(12) United States Patent
Kagayama et al.

(10) Patent No.: US 11,453,029 B2
(45) Date of Patent: Sep. 27, 2022

(54) VIBRATION DEVICE AND METHOD OF MANUFACTURING THE SAME

(71) Applicant: Murata Manufacturing Co., Ltd., Nagaokakyo (JP)

(72) Inventors: Kenji Kagayama, Nagaokakyo (JP); Junichi Nomura, Nagaokakyo (JP); Haruyoshi Kurakawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 663 days.

(21) Appl. No.: 16/289,883

(22) Filed: Mar. 1, 2019

(65) Prior Publication Data

US 2019/0240697 A1 Aug. 8, 2019

Related U.S. Application Data

(63) Continuation of application No. PCT/JP2017/032203, filed on Sep. 7, 2017.

(30) Foreign Application Priority Data

Sep. 12, 2016 (JP) .............................. JP2016-177415

(51) Int. Cl.
*B06B 1/06* (2006.01)
*H01L 41/09* (2006.01)
(Continued)

(52) U.S. Cl.
CPC .............. *B06B 1/0644* (2013.01); *B06B 1/06* (2013.01); *B06B 1/0603* (2013.01); *B06B 1/14* (2013.01);
(Continued)

(58) Field of Classification Search
CPC . H01L 41/0986; H01L 41/053; H01L 41/047; H01L 41/0472; B06B 1/0644
(Continued)

(56) References Cited

U.S. PATENT DOCUMENTS 8,513,858 B2    8/2013  Kagayama et al.
2007/0080608 A1*  4/2007  Maruyama ......... H03K 17/9643
                                              310/317

(Continued)

FOREIGN PATENT DOCUMENTS

JP      H10285253 A    10/1998
JP      H11313395 A    11/1999
(Continued)

OTHER PUBLICATIONS

International Search Report issued in PCT/JP2017/032203, dated Dec. 12, 2017.
(Continued)

*Primary Examiner* — Derek J Rosenau
(74) *Attorney, Agent, or Firm* — ArentFox Schiff LLP (57) ABSTRACT

A vibration device that includes a first elastic plate having a first end portion and a second end portion, and a first surface and a second surface facing each other and connecting the first and second end portions. A second elastic plate is laminated to the second end portion of the first elastic plate, and a piezoelectric vibration element is provided on at least one of the first surface and the second surface of the first elastic plate. On a portion where the first elastic plate and the second elastic plate are laminated, a first bonding portion and a second bonding portion that bond the first elastic plate and the second elastic plate to each other are provided. The second bonding portion is located closer to the first end portion than the first bonding portion.

14 Claims, 6 Drawing Sheets

(51) Int. Cl.
*H01L 41/053* (2006.01)
*H01L 41/25* (2013.01)
*B06B 1/14* (2006.01)

(52) U.S. Cl.
CPC .......... *H01L 41/053* (2013.01); *H01L 41/094* (2013.01); *H01L 41/0933* (2013.01); *H01L 41/0986* (2013.01); *H01L 41/25* (2013.01)

(58) Field of Classification Search
USPC ................................ 310/324, 348, 365, 366
See application file for complete search history.

(56) References Cited

U.S. PATENT DOCUMENTS

| | | | | |
|---|---|---|---|---|
| 2008/0049955 | A1* | 2/2008 | Fujiwara | H04R 17/00 381/190 |
| 2009/0096299 | A1 | 4/2009 | Ota et al. | |
| 2011/0095649 | A1 | 4/2011 | Kagayama et al. | |
| 2014/0070667 | A1* | 3/2014 | Oh | H02N 2/001 310/326 |
| 2016/0027989 | A1* | 1/2016 | Ludlow | H01L 41/0973 310/317 |
| 2016/0313795 | A1 | 10/2016 | Muramatsu | |

FOREIGN PATENT DOCUMENTS

| | | |
|---|---|---|
| JP | 2005095739 A | 4/2005 |
| JP | 2006165318 A | 6/2006 |
| JP | 2009195895 A | 9/2009 |
| WO | 2006070595 A1 | 7/2006 |
| WO | 2009141970 A1 | 11/2009 |
| WO | 2015092966 A1 | 6/2015 |

OTHER PUBLICATIONS

Written Opinion of the International Searching Authority issued in PCT/JP2017/032203, dated Dec. 12, 2017.

* cited by examiner

VIBRATION DEVICE AND METHOD OF MANUFACTURING THE SAME

CROSS REFERENCE TO RELATED APPLICATIONS

The present application is a continuation of International application No. PCT/JP2017/032203, filed Sep. 7, 2017, which claims priority to Japanese Patent Application No. 2016-177415, filed Sep. 12, 2016, the entire contents of each of which are incorporated herein by reference.

FIELD OF THE INVENTION

The present invention relates to a vibration device and a method of manufacturing the same.

BACKGROUND OF THE INVENTION

Various vibration devices have been proposed, as vibration devices used for the purpose of informing an incoming call or the like. In Patent Document 1 described below, an example of such a vibration device is disclosed. In the vibration device described in Patent Document 1, an elastic plate is fixed to a base member by a bolt.
Patent Document 1: Japanese Unexamined Patent Application Publication No. 11-313395

SUMMARY OF THE INVENTION

In the vibration device described in Patent Document 1, bonding strength between the elastic plate and the base member is insufficient. In addition, there is a tendency that stress concentrates on a portion of the elastic plate that is fixed to the base member when the elastic plate vibrates. Thus, fatigue failure occurs in the elastic plate in some cases.

An object of the present invention is to provide a vibration device that has high bonding strength and is difficult to break, and a method of manufacturing such a vibration device.

A vibration device according to the present invention includes a first elastic plate having first and second end portions, and first and second surfaces facing each other and connecting the first and second end portions, a first base member laminated to the second end portion of the first elastic plate, a piezoelectric vibration element on at least one of the first and second surfaces of the first elastic plate, and first and second bonding portions that bond the first elastic plate and the first base member provided on a portion where the first elastic plate and the first base member are laminated to each other, the second bonding portion located closer to the first end portion than the first bonding portion.

In a specific aspect of the vibration device according to the present invention, in a plan view of the vibration device, the first elastic plate has a length direction connecting the first end portion with the second end portion, and a width direction perpendicular to the length direction, and a plurality of first bonding portions bonding the first elastic plate and the first base member are provided along the width direction, and a plurality of second bonding portions bonding the first elastic plate and the first base member are provided along the width direction. In this case, it is possible to further increase bonding force between the first and second elastic plates.

In another specific aspect of the vibration device according to the present invention, the plurality of second bonding portions are not in contact with each other. In this case, it is possible to reduce bias of portions where cracking easily occurs, of the first elastic plate.

In still another specific aspect of the vibration device according to the present invention, the plurality of second bonding portions are provided at equal intervals. In this case, bias of stress applied to the first elastic plate is less likely to occur. Thus, the first elastic plate is more difficult to break.

In another specific aspect of the vibration device according to the present invention, in a portion where the first elastic plate and the first base member are laminated, a thickness of the first base member is larger than a thickness of the first elastic plate. In this case, heat can be efficiently propagated from a side of the first elastic plate to a side of the second elastic plate. Accordingly, when the first elastic plate is made of an austenitic SUS material or the like, and the first and second bonding portions are formed by irradiation with laser light, a crystal grain size of the first elastic plate is less likely to increase excessively. Therefore, the cracking of the first elastic plate due to the stress application is further less likely to occur.

In yet another specific aspect of the vibration device according to the present invention, in the plan view, a portion of the second bonding portion closest to the first end portion is curved. In this case, the first elastic plate is more difficult to break.

In still another specific aspect of the vibration device according to the present invention, the first and second bonding portions are portions where the first elastic plate and the first base member are welded to each other. In this case, productivity can be increased.

In still another specific aspect of the vibration device according to the present invention, in the plan view, the first bonding portion and the second bonding portion are in contact with each other. In this case, variations in shapes of the second bonding portions can be effectively reduced, and variations in vibration characteristics of the vibration device can be effectively reduced.

In still another specific aspect of the vibration device according to the present invention, the first and second bonding portions are made of a member separate from the first elastic plate, and the first and second bonding portions penetrate portions of the first elastic plate and the first base member.

In still another specific aspect of the vibration device according to the present invention, a mass adding member is attached to the first end portion of the first elastic plate, and the first base member is a second elastic plate facing the first elastic plate. In this case, it is possible to increase vibration of the vibration device.

In a further specific aspect of the vibration device according to the present invention, the first base member is a second elastic plate facing the first elastic plate, the first elastic plate has a planar portion including the first end portion, a laminated portion that is laminated to the second elastic plate, and a connecting portion that connects the planar portion with the laminated portion, and the laminated portion extends from the connecting portion in a direction opposite to the first end portion, and the first surface is parallel in the laminated portion and the planar portion. In this case, productivity can be increased.

In still another specific aspect of the vibration device according to the present invention, a second base member is laminated to the first surface of the first elastic plate at the first end portion thereof, and third and fourth bonding portions that bond the first elastic plate and the second base member are provided on the portion where the first elastic plate and the second base member are laminated to each other, and the fourth bonding portion is located closer to the second end portion than the third bonding portion.

In still another specific aspect of the vibration device according to the present invention, the first elastic plate and the first base member are made of metal.

A method of manufacturing a vibration device according to the present invention includes preparing a first elastic plate having first and second end portions and first and second surfaces facing each other and connecting the first and second end portions, preparing a first base member, providing a piezoelectric vibration element on at least one of the first and second surfaces of the first elastic plate, laminating the first elastic plate and the first base member to each other at the second end portion, forming a first bonding portion bonding the first elastic plate and the first base member on a portion where the first elastic plate and the first base member are laminated, and forming a second bonding portion bonding the first elastic plate and the first base member on the portion where the first elastic plate and the first base member are laminated, the second bonding portion located closer to the first end portion than the first bonding portion.

In a specific aspect of the method of manufacturing the vibration device according to the present invention, in the plan view, the first elastic plate has a length direction connecting the first end portion with the second end portion, and a width direction perpendicular to the length direction, and a plurality of first bonding portions bonding the first elastic plate and the first base member are formed along the width direction, and a plurality of second bonding portions bonding the first elastic plate and the first base member are formed along the width direction. In this case, it is possible to further increase bonding force between the first and second elastic plates.

In another specific aspect of the method of manufacturing the vibration device according to the present invention, the first bonding portion is formed by irradiation with laser light, and, after the first bonding portion is provided, the second bonding portion is formed by irradiation with laser light.

In still another specific aspect of the method of manufacturing the vibration device according to the present invention, the laser light is irradiated so that the second bonding portion is brought into contact with the first bonding portion. In this case, variations in shapes of the second bonding portions can be effectively reduced, and variations in vibration characteristics of the vibration device can be effectively reduced.

According to the present invention, it is possible to provide a vibration device that has high bonding strength and is difficult to break, and a method of manufacturing the vibration device.

DETAILED DESCRIPTION OF THE PREFERRED EMBODIMENTS

Hereinafter, specific embodiments of the present invention will be described with reference to the accompanying drawings, to clarify the present invention.

It should be noted that each of the embodiments described herein is exemplary and that partial replacement or combination of the configurations is possible between different embodiments.

Figure 1:
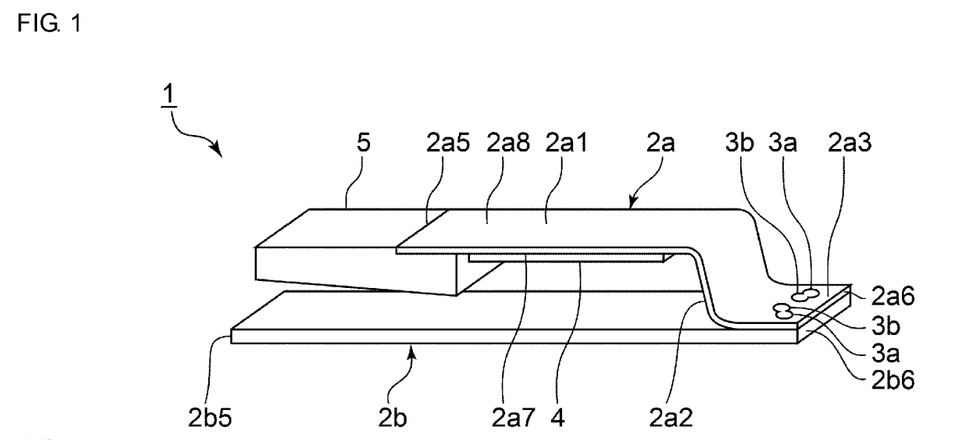
FIG. 1 is a perspective view of a vibration device according to a first embodiment of the present invention.

FIG. 1 is a perspective view of a vibration device according to a first embodiment of the present invention.

A vibration device 1 can be used for a vibration notification function or the like of a portable electronic device. The vibration device 1 has a first elastic plate 2a. The first elastic plate 2a has a first end portion 2a5 and a second end portion 2a6 that are one end portion and the other end portion, respectively. The first elastic plate 2a has a first surface 2a7 and a second surface 2a8 facing each other. In plan view, the first elastic plate 2a has a length direction that is a direction connecting the first end portion 2a5 with the second end portion 2a6. The first elastic plate 2a also has a width direction that is a direction perpendicular to the length direction, in plan view. In the present description, the plan view refers to a direction when viewing the vibration device from above the second surface 2a8 and toward the first surface 2a7 of the first elastic plate 2a.

The vibration device 1 has a second elastic plate 2b as a first base member that is bonded to a side of the second end portion 2a6 of the first elastic plate 2a. More specifically, the first elastic plate 2a and the second elastic plate 2b are laminated on the side of the second end portion 2a6. In this laminated portion, the first elastic plate 2a and the second elastic plate 2b are bonded to each other.

Although details will be described later, the first elastic plate 2a and the second elastic plate 2b are bonded to each other by a first bonding portion 3a and a second bonding portion 3b. The second bonding portion 3b is located closer to the first end portion 2a5 than the first bonding portion 3a. Note that, in the specification, the term "located closer to the first end portion 2a5" means "located closer to the first end portion 2a5 when the first elastic plate 2a is formed into a flat plate shape that is not bent". For example, when the first elastic plate is U-shaped, a portion other than the second end portion is located closer to the first end portion than the second end portion.

As shown in FIG. 1, the second elastic plate 2*b* has a third end portion 2*b*5 and a fourth end portion 2*b*6 that are one end portion and the other end portion, respectively. The second elastic plate 2*b* is bonded to the first elastic plate 2*a* on a side of the fourth end portion 2*b*6. The second elastic plate 2*b* has a length direction that is a direction connecting the third end portion 2*b*5 with the fourth end portion 2*b*6, in plan view. The second elastic plate 2*b* also has a width direction that is a direction perpendicular to the length direction, in plan view. The respective length directions of the first elastic plate 2*a* and the second elastic plate 2*b* are in the same direction, and the respective width directions of the first elastic plate 2*a* and the second elastic plate 2*b* are in the same direction. Note that the length directions and the width directions of the first elastic plate 2*a* and the second elastic plate 2*b* are not limited to those described above. Further, each of the first elastic plate 2*a* and the second elastic plate 2*b* has also a thickness direction perpendicular to the length direction and the width direction.

The first elastic plate 2*a* has a planar portion 2*a*1 including the first end portion 2*a*5, and a laminated portion 2*a*3 that is a portion laminated to the second elastic plate 2*b* on the side of the second end portion 2*a*6. The first elastic plate 2*a* has a connecting portion 2*a*2 that connects the planar portion 2*a*1 with the laminated portion 2*a*3. The planar portion 2*a*1 and the laminated portion 2*a*3 have a flat plate shape. A tip portion of the laminated portion 2*a*3 corresponds to the second end portion 2*a*6. In the present embodiment, the first surface 2*a*7 is a surface on a side of the second elastic plate 2*b* of the planar portion 2*a*1, the connecting portion 2*a*2, and the laminated portion 2*a*3.

In the connecting portion 2*a*2, the first elastic plate 2*a* is bent toward the side of the second elastic plate 2*b*. Both end portions of the connecting portion 2*a*2 are curved. Alternatively, at least one of both the end portions of the connecting portion 2*a*2 may be bent so as to have a corner portion. The laminated portion 2*a*3 extends from the connecting portion 2*a*2 in a direction departing from the first end portion 2*a*5. The first surface 2*a*7 extends parallel in the laminated portion 2*a*3 and the planar portion 2*a*1. In the present embodiment, the first surface 2*a*7 in the laminated portion 2*a*3 is bonded to the second elastic plate 2*b*.

On the other hand, the second elastic plate 2*b* has a flat plate shape. A thickness of the second elastic plate 2*b* is larger than a thickness of the first elastic plate 2*a*. Therefore, in a portion where the first elastic plate 2*a* and the second elastic plate 2*b* are laminated, the thickness of the second elastic plate 2*b* is larger than the thickness of the first elastic plate 2*a*.

In the present embodiment, the first elastic plate 2*a* and the second elastic plate 2*b* are made of an austenitic SUS material containing carbon. Note that the first elastic plate 2*a* and the second elastic plate 2*b* may be made of other materials having elasticity, such as metal and resin, other than the material described above. However, as in the present embodiment, the first elastic plate 2*a* and the second elastic plate 2*b* are preferably made of metal such as stainless steel. Thus, vibration of the vibration device is less likely to attenuate.

As described above, the first elastic plate 2*a* and the second elastic plate 2*b* are bonded to each other by the first bonding portion 3*a* and the second bonding portion 3*b*. Two first bonding portions 3*a* are provided on two locations along the width direction. Two second bonding portions 3*b* are also provided on two locations along the width direction. Note that, it is sufficient that each of the first bonding portion 3*a* and the second bonding portion 3*b* is provided on at least one location.

In the present embodiment, the first elastic plate 2*a* and the second elastic plate 2*b* are welded to each other by irradiation with laser light. In other words, the first bonding portion 3*a* and the second bonding portion 3*b* are portions where the first elastic plate 2*a* and the second elastic plate 2*b* are welded to each other.

Figure 2:
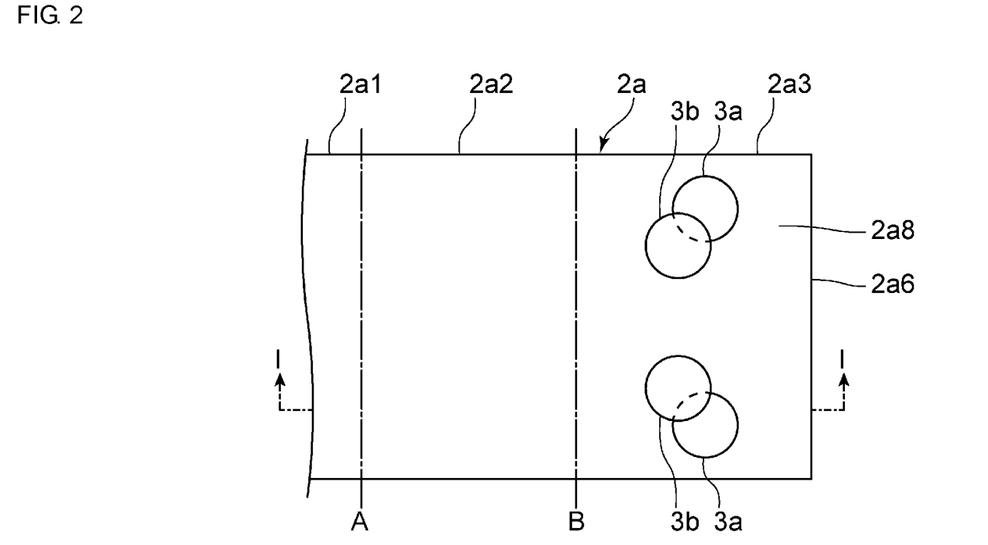
FIG. 2 is a plan view showing a vicinity of first and second bonding portions in the first embodiment of the present invention.
Figure 3:
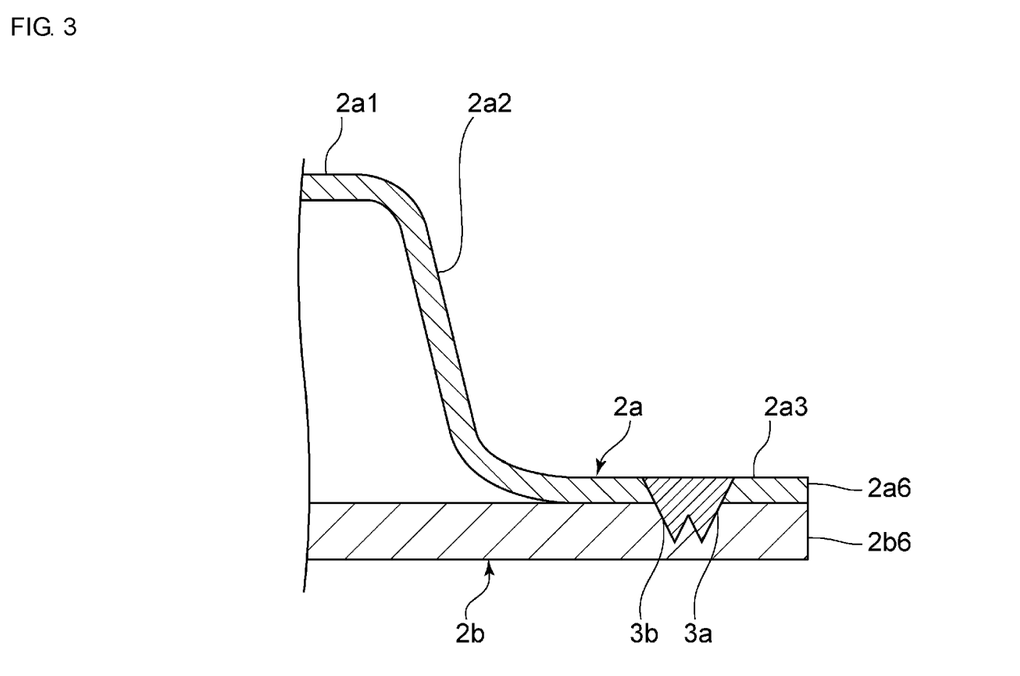
FIG. 3 is a sectional view taken along a line I-I in FIG. 2 showing the vicinity of the first and second bonding portions in the first embodiment of the present invention.

FIG. 2 is a plan view showing a vicinity of the first and second bonding portions in the first embodiment. FIG. 3 is a sectional view taken along the line I-I in FIG. 2 and showing the vicinity of the first and second bonding portions in the first embodiment. Note that, a dashed-dotted line A in FIG. 2 indicates a boundary between the planar portion and the connecting portion in the first elastic plate, and a dashed-dotted line B indicates a boundary between the connecting portion and the laminated portion.

As shown in FIG. 2, in the present embodiment, a planar shape of each of the first bonding portion 3*a* and the second bonding portion 3*b* is not particularly limited, but is circular. In plan view, the first bonding portion 3*a* and the second bonding portion 3*b* are in contact with each other. As shown in FIG. 2 and FIG. 3, the first bonding portion 3*a* and the second bonding portion 3*b* are integrated at the portion where they are in contact.

Referring back to FIG. 1, the vibration device 1 has a piezoelectric vibration element 4 provided on the first surface 2*a*7 in the planar portion 2*a*1 of the first elastic plate 2*a*. The piezoelectric vibration element 4 is fixed to the first elastic plate 2*a* by using, for example, an appropriate adhesive such as a thermosetting resin adhesive. Note that, it is sufficient that the piezoelectric vibration element 4 is provided on at least one of the first surface 2*a*7 and the second surface 2*a*8. However, the piezoelectric vibration element 4 is preferably provided on the first surface 2*a*7. Thus, reduction in size can be promoted, and breakage of the piezoelectric vibration element 4 due to external impact or the like is less likely to occur.

By applying an alternating electric field to the piezoelectric vibration element 4, the piezoelectric vibration element 4 expands and contracts in an in-plane direction. When the piezoelectric vibration element 4 expands and contracts, a warp occurs in the first elastic plate 2*a*. Accordingly, the first elastic plate 2*a* vibrates since a state in which the first end portion 2*a*5 is displaced downward in FIG. 1 and a state in which the first end portion 2*a*5 is displaced upward are repeated. Vibration of the first elastic plate 2*a* propagates to the second elastic plate 2*b* via the laminated portion 2*a*3. Here, the vibration device 1 is mounted from the side of the second elastic plate 2*b*. The vibration of the vibration device 1 propagates from the second elastic plate 2*b* to an outside. Thus, the above vibration notification function and the like can be achieved.

A mass adding member 5 is attached to the first end portion 2*a*5 of the first elastic plate 2*a*. The mass adding member 5 allows a resonance frequency of the vibration device 1 to be adjusted. Further, by adding the mass adding member 5, it is possible to increase mass of a tip of a pendulum consisting of the first elastic plate 2*a*, and to increase the vibration of the vibration device 1. The mass adding member 5 is made of suitable metal, a synthetic material of metal and resin, ceramics, or the like. Preferably, high density metal, such as tungsten, is preferred because of high mass addition effect.

A surface of the mass adding member 5 on the side of the second elastic plate 2b includes an inclined surface. As a result, a thickness of the mass adding member 5 decreases as a distance from the first end portion 2a5 of the first elastic plate 2a increases. Here, a thickness direction of the mass adding member 5 is in the same direction as the thickness directions of the first elastic plate 2a and the second elastic plate 2b. Thus, when the first elastic plate 2a vibrates, the mass adding member 5 is less likely to collide with the second elastic plate 2b. Thus, it is possible to more efficiently propagate the vibration to the outside. Note that there is no particular limitation on a shape of the mass adding member 5.

A feature of the present embodiment is that the first bonding portion 3a and the second bonding portion 3b that bond the first elastic plate 2a and the second elastic plate 2b are provided, and the second bonding portion 3b is located closer to the first end portion 2a5 than the first bonding portion 3a. As a result, bonding strength between the first elastic plate 2a and the second elastic plate 2b can be increased, and the first elastic plate 2a is difficult to break. This will be described below.

In the vibration device 1 shown in FIG. 1, in accordance with the vibration of the first elastic plate 2a, stress is concentrated at a portion where the first elastic plate 2a and the second elastic plate 2b are bonded to each other. Here, the second bonding portion 3b is provided at a location closer to the piezoelectric vibration element 4 than the first bonding portion 3a. Therefore, stress applied at the second bonding portion 3b is larger than stress applied at the first bonding portion 3a.

In the present embodiment, the first bonding portion 3a is provided while portions where the second bonding portions 3b are disposed are reduced. As a result, it is possible to increase the portions where the first elastic plate 2a and the second elastic plate 2b are bonded to each other, while the portions where large stress is applied are reduced. Accordingly, the bonding strength between the first elastic plate 2a and the second elastic plate 2b can be increased, and the first elastic plate 2a is difficult to break.

As described above, in the vibration device 1, the first bonding portion 3a and the second bonding portion 3b are portions welded to each other by the irradiation with the laser light. Thus, the first elastic plate 2a and the second elastic plate 2b can be easily bonded to each other, and thus, productivity can be increased.

In addition, in the present embodiment, the first elastic plate 2a and the second elastic plate 2b are made of the austenitic SUS material. When welding by irradiation with laser light is used in bonding of such members, a layer having a large crystal grain size tends to be generated due to influence of applied heat. Thus, there is a possibility that cracking easily occurs in a welded portion, due to application of stress. On the other hand, in the present embodiment, it is possible to increase the bonding strength while reducing the portions where the second bonding portions 3b, which are portions to which large stress is applied, are disposed. Thus, it is possible to increase productivity, while the above material by which vibration is less likely to attenuate is used, and the above cracking is less likely to occur.

As in the present embodiment, in the portion where the first elastic plate 2a and the second elastic plate 2b are laminated, the thickness of the second elastic plate 2b is preferably larger than the thickness of the first elastic plate 2a. Accordingly, heat generated by the irradiation with the laser light can be efficiently propagated from a side of the first elastic plate 2a toward the side of the second elastic plate 2b. Therefore, heat is less likely to stay in the first elastic plate 2a. Thus, when the first elastic plate 2a is made of the austenitic SUS material or the like, the crystal grain size is less likely to increase excessively in a vicinity of a portion irradiated with the laser light of the first elastic plate 2a. Therefore, cracking of the first elastic plate 2a due to application of stress is less likely to occur.

A plurality of the first bonding portions 3a is preferably provided along the width direction. Similarly, a plurality of the second bonding portions 3b is preferably provided along the width direction. Thus, the bonding strength can be suitably increased.

The number of the second bonding portions 3b may be larger than the number of the first bonding portions 3a. Even in this case, it is possible to increase the portions where the first elastic plate 2a and the second elastic plate 2b are bonded to each other, without significantly increasing the number of the second bonding portions 3b. However, the number of the second bonding portions 3b is preferably smaller than the number of the first bonding portions 3a. As a result, the first elastic plate 2a is more difficult to break.

As shown in FIG. 1, in the vibration device 1, two first bonding portions 3a are provided individually, and two second bonding portions 3b are provided individually. In this case, in the first elastic plate 2a, it is possible to reduce a portion where the above-described cracking easily occurs, and to increase the bonding strength.

As in the present embodiment, it is preferable that the plurality of second bonding portions 3b be not in contact with each other. Accordingly, it is possible to reduce bias among portions of the first elastic plate 2a where the cracking easily occurs.

As described above, in the present embodiment, the planar shape of the second bonding portion 3b shown in FIG. 1 is circular. As described above, in plan view, it is preferable that a portion of the second bonding portion 3b closest to the first end portion 2a5 be curved. In accordance with the vibration of the first elastic plate 2a, stress applied to a portion close to the first end portion 2a5 in the second bonding portion 3b is particularly large. In the present embodiment, the curved portion of the second bonding portion 3b is in contact with the portion where the stress is particularly concentrated. As a result, the first elastic plate 2a is further more difficult to break.

Note that, the planar shape of the second bonding portion 3b in which the portion closest to the first end portion 2a5 is curved is not limited to circular, and may be another shape such as an oval shape, for example.

Hereinafter, a method of manufacturing the vibration device 1 according to the present embodiment will be described.

FIG. 4(a) to FIG. 4(d) are perspective views for explaining a method of manufacturing the vibration device according to the first embodiment of the present invention.

Figure 4A:
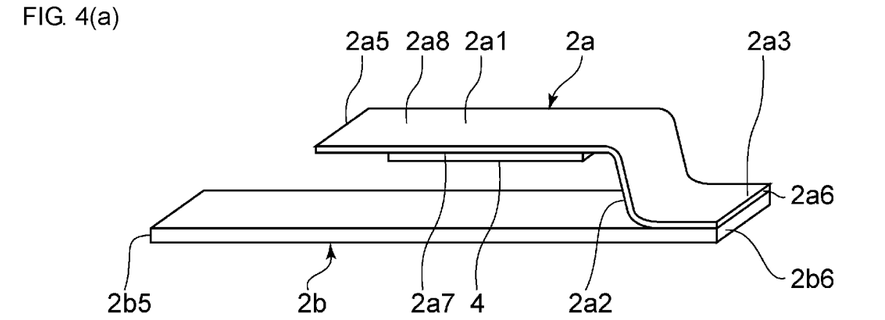
FIG. 4(a) to FIG. 4(d) are perspective views for explaining a method of manufacturing the vibration device according to the first embodiment of the present invention.

As shown in FIG. 4(a), the first elastic plate 2a and the second elastic plate 2b are prepared. The first elastic plate 2a can be prepared, for example, by bending an elastic plate having a flat plate shape, and forming the connecting portion 2a2. Here, the first elastic plate 2a extends in one direction from the first end portion 2a5 to the second end portion 2a6, in plan view, and the planar portion 2a1 and the laminated portion 2a3 extend in parallel. As described above, the first elastic plate 2a can be easily formed by bending or the like since a shape thereof is simple, and thus, productivity can be increased.

Figure 4B:
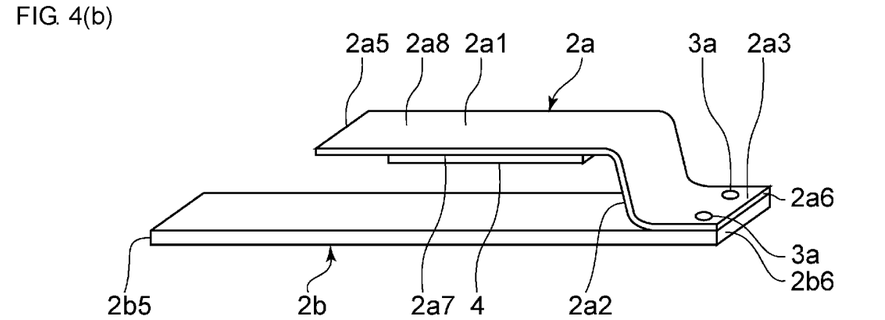

Next, the piezoelectric vibration element 4 is provided on the first surface 2a7 in the planar portion 2a1 of the first elastic plate 2a. Note that, it is sufficient that the piezoelectric vibration element 4 is provided on at least one of the first surface 2a7 and the second surface 2a8. Next, the first elastic plate 2a and the second elastic plate 2b are laminated on the side of the second end portion 2a6. Next, in this state, a portion where the first elastic plate 2a and the second elastic plate 2b are laminated is irradiated with laser light from the side of first elastic plate 2a. At this time, in the first elastic plate 2a and the second elastic plate 2b, the portion irradiated with the laser light, and a portion to which heat is propagated from the irradiated portion and which is highly heated, are melted, and the first elastic plate 2a and the second elastic plate 2b are welded together. As a result, as shown in FIG. 4(b), the first bonding portion 3a is provided. In the present embodiment, the first bonding portions 3a are formed on two locations in the width direction. Note that the first bonding portions 3a are formed so as not to be in contact with each other.

Figure 4C:
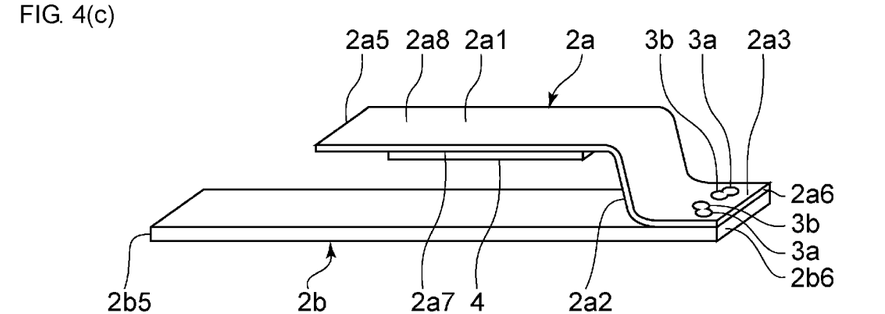

Next, the portion on which the first elastic plate 2a and the second elastic plate 2b are laminated, and which is closer to the first end portion 2a5 than the first bonding portion 3a, is irradiated with laser light, from the side of the first elastic plate 2a. As a result, as shown in FIG. 4(c), the second bonding portion 3b is formed. Also, the second bonding portions 3b are formed on two locations in the width direction. Note that, it is sufficient that each of the first bonding portion 3a and the second bonding portion 3b is formed on at least one location in the width direction.

Preferably, the second bonding portion 3b is formed so as to be in contact with the first bonding portion 3a. The first elastic plate 2a and the second elastic plate 2b are welded and integrated at the first bonding portion 3a. Accordingly, heat is easily propagated at the first bonding portion 3a. Therefore, by irradiation with laser light so that the second bonding portion 3b is in contact with the first bonding portion 3a, heat for forming the second bonding portion 3b can be more reliably propagated through the first elastic plate 2a and the second elastic plate 2b. Thus, it is possible to effectively reduce variations in shapes of the second bonding portions 3b.

Here, a portion of the first elastic plate 2a, closer to the first end portion 2a5 than the second bonding portion 3b, bends and vibrates. In the present embodiment, since the variations in the shapes of the second bonding portions 3b are small, it is possible to reduce variations in shapes of portions of the first elastic plate 2a that bend and vibrate. Accordingly, it is possible to effectively reduce variations in vibration characteristics of the vibration device 1. In particular, it is possible to reduce variation in an inherent resonance frequency of the vibration device 1.

Figure 4D:
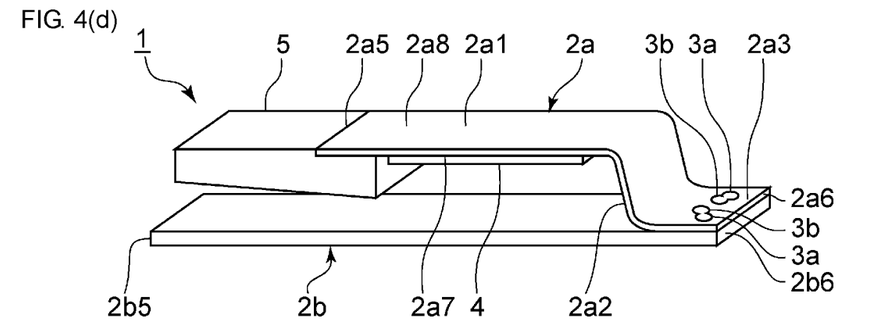

Next, as shown in FIG. 4(d), the mass adding member 5 is attached to the first end portion 2a5 of the first elastic plate 2a. As described above, it is possible to obtain the vibration device 1.

Figure 5:
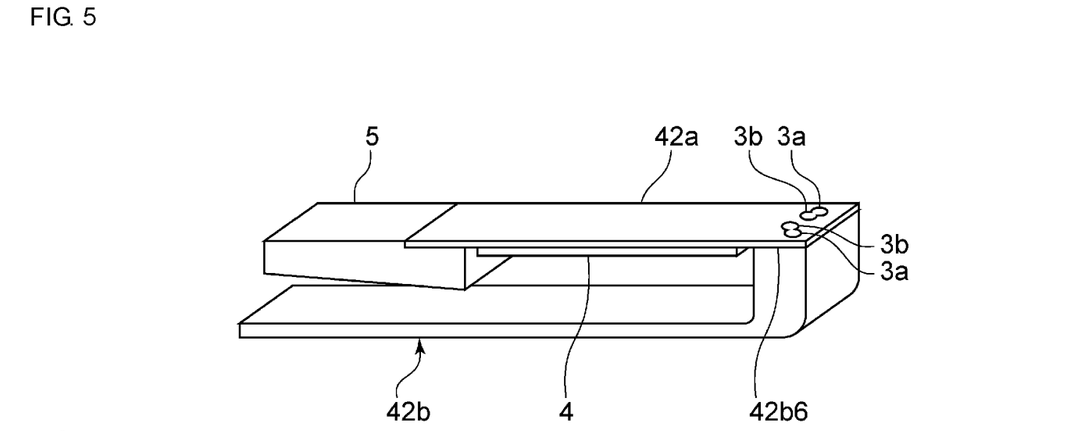
FIG. 5 is a perspective view of a vibration device according to a modification of the first embodiment of the present invention.

As in a modification of the first embodiment shown in FIG. 5, a first elastic plate 42a may have a flat plate shape, and a second elastic plate 42b may have a bent shape. In the modification, the second elastic plate 42b is bonded to the first elastic plate 42a at a fourth end portion 42b6. In this way, the respective shapes of the first and second elastic plates are not particularly limited.

Figure 6:
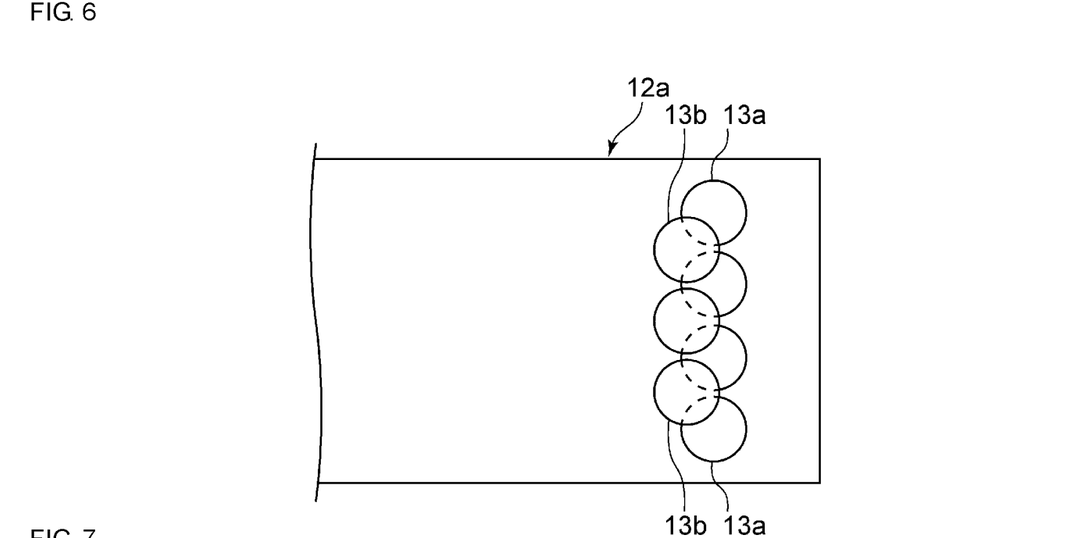
FIG. 6 is a plan view showing a vicinity of first and second bonding portions in a second embodiment of the present invention.

FIG. 6 is a plan view showing a vicinity of first and second bonding portions in a second embodiment.

A vibration device according to the second embodiment is different from that of the first embodiment in that first bonding portions 13a are provided at three or more locations and second bonding portions 13b are provided at three or more locations. Except for the above points, the vibration device of the second embodiment has the same configuration as the vibration device 1 of the first embodiment.

In the present embodiment as well, similarly to the first embodiment, bonding strength between a first elastic plate 12a and a second elastic plate is high and the first elastic plate 12a is difficult to break.

Each second bonding portion 13b is in contact with two first bonding portions 13a. Thus, it is possible to further reduce variations in shapes of the second bonding portions 13b.

As shown in FIG. 6, it is preferable that a plurality of the second bonding portions 13b be provided at equal intervals. Thus, stress applied to the first elastic plate 12a is difficult to be biased. Therefore, the first elastic plate 12a is further more difficult to break.

Note that, in the present embodiment, a bonding portion located at an outermost side portion in the width direction of the first elastic plate 2a is the first bonding portion 13a. Note that, the bonding portion located at the outermost side portion in the width direction may be the second bonding portion 13b.

Figure 7:
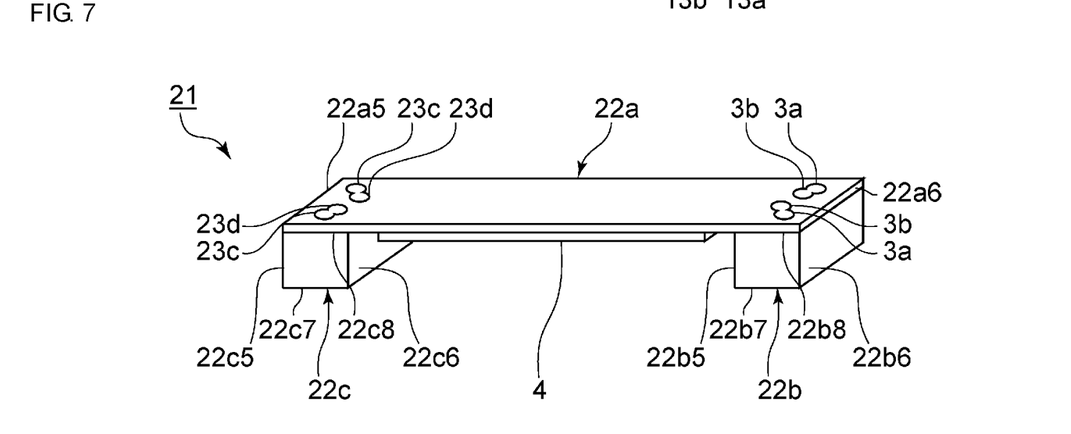
FIG. 7 is a perspective view of a vibration device according to a third embodiment of the present invention.

FIG. 7 is a perspective view of a vibration device according to a third embodiment.

A vibration device 21 is a vibration device that is held at both ends. The vibration device 21 has an elastic plate 22a as a first elastic plate. The elastic plate 22a has a flat plate shape. The vibration device 21 has a first base member 22b and a second base member 22c bonded to the elastic plate 22a. Although there is no particular limitation on respective shapes of the first base member 22b and the second base member 22c, the first and second base members have a rectangular parallelepiped shape.

The first base member 22b has a first main surface 22b7 and a second main surface 22b8 facing each other in a direction parallel to a thickness direction of the elastic plate 22a. The second main surface 22b8 is a main surface located on a side of the elastic plate 22a. The first base member 22b has a first side surface 22b5 and a second side face 22b6 that connect the first main surface 22b7 with the second main face 22b8, and face each other in a length direction of the elastic plate 22a. The first side surface 22b5 is a side surface located on a side of a first end portion 22a5 of the elastic plate 22a. Similarly, the second base member 22c also has a first main surface 22c7, a second main surface 22c8, a first side surface 22c5, and a second side surface 22c6.

Although the elastic plate 22a, the first base member 22b, and the second base member 22c are not particularly limited, they are made of the austenitic SUS material containing carbon.

The first base member 22b is bonded to a side of a second end portion 22a6 of the elastic plate 22a. More specifically, the first base member 22b is laminated to the elastic plate 22a, from a side of the second main surface 22b8. As in the first embodiment, the first bonding portion 3a and the second bonding portion 3b are provided on a portion where the elastic plate 22a and the first base member 22b are laminated.

The second base member 22c is bonded to a side of the first end portion 22a5 of the elastic plate 22a. More specifically, the second base member 22c is laminated to the elastic plate 22a from a side of the second main surface 22c8. In a portion where the elastic plate 22a and the second base member 22c are laminated, a third bonding portion 23c and a fourth bonding portion 23d that bond the elastic plate 22a and the second base member 22c are provided. The third bonding portion 23c and the fourth bonding portion 23d have the same configurations as those of the first bonding portion 3a and the second bonding portion 3b, respectively. The fourth bonding portion 23d is provided closer to the second end portion 22a6 than the third bonding portion 23c.

It is sufficient that each of the first bonding portion 3a, the second bonding portion 3b, the third bonding portion 23c, and the fourth bonding portion 23d is provided on at least one location in the width direction.

In the present embodiment as well, as in the first embodiment, bonding strength between the elastic plate 22a and the first base member 22b, and between the elastic plate 22a and the second base member 22c can be increased, and the elastic plate 22a is difficult to break.

Figure 8:
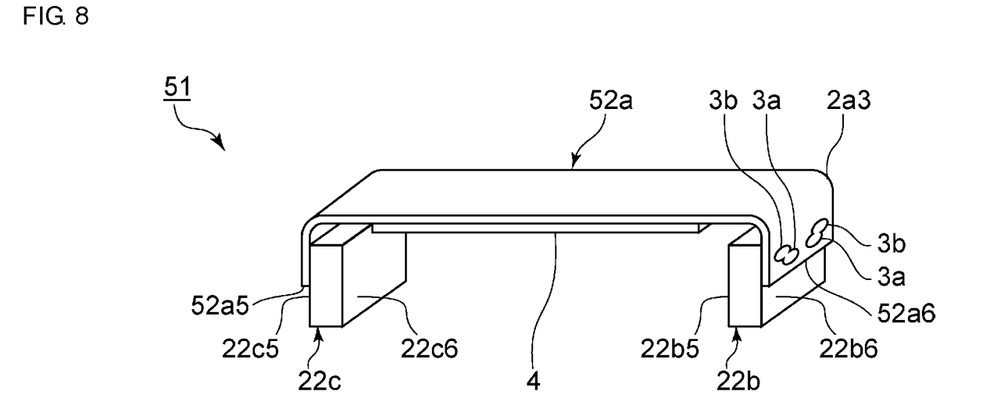
FIG. 8 is a perspective view of a vibration device according to a modification of the third embodiment of the present invention.

As in a modification of the third embodiment shown in FIG. 8, an elastic plate 52a need not have a flat plate shape. The elastic plate 52a is substantially U-shaped, in which each of a vicinity of a first end portion 52a5 and a vicinity of a second end portion 52a6 is curved. In a vibration device 51, the vicinity of the second end portion 52a6 of the elastic plate 52a and a second side surface 22b6 of the first base member 22b are laminated and bonded to each other. The vicinity of the first end portion 52a5 of the elastic plate 52a and a first side surface 22c5 of the second base member 22c are laminated and bonded to each other.

As in the vibration device 51, in a width direction of the elastic plate 52a, the second bonding portion 3b may be provided at an outer side of the first bonding portion 3a. Similarly, in the above width direction, a fourth bonding portion may be provided at an outer side of a third bonding portion.

In the first to third embodiments and each modification, the first and second bonding portions are portions welded by irradiation with laser light. In addition, the first and second bonding portions may be made of a member separate from that of the first elastic plate. This example will be described below.

Figure 9:
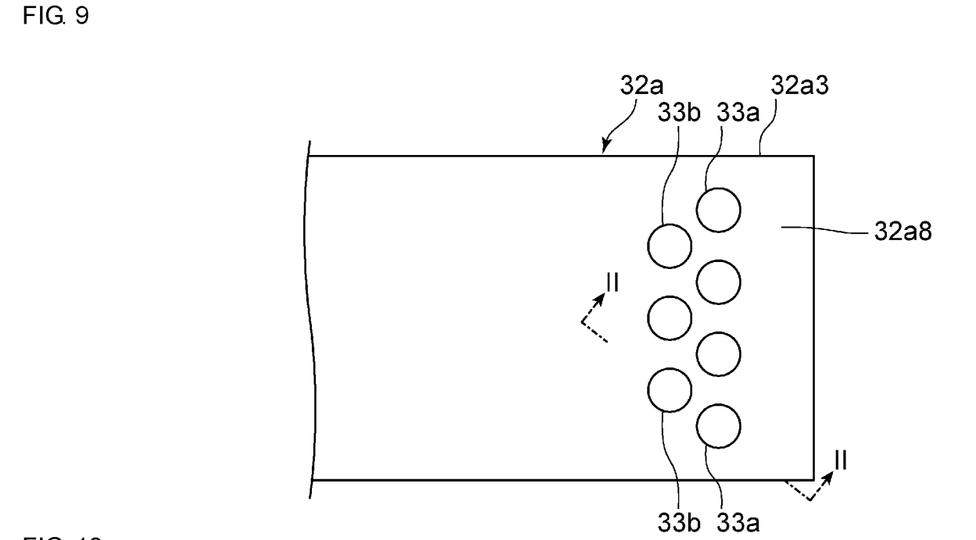
FIG. 9 is a plan view showing a vicinity of first and second bonding portions in a fourth embodiment of the present invention.
Figure 10:
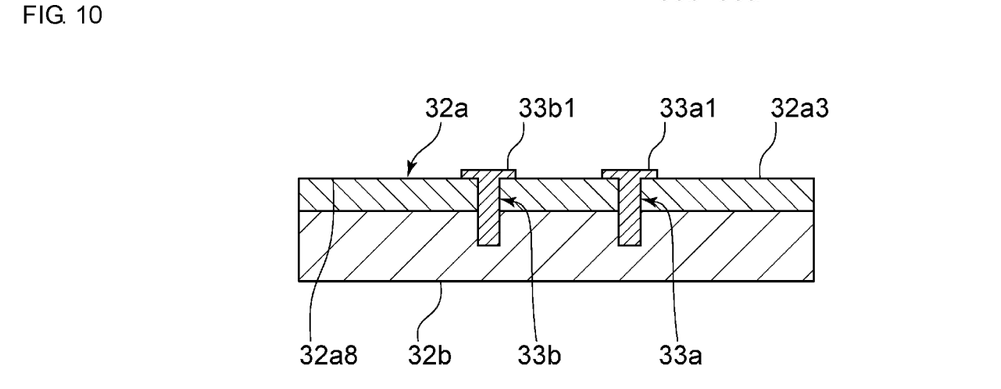
FIG. 10 is a sectional view taken along a line II-II in FIG. 9 and showing the vicinity of the first and second bonding portions in the fourth embodiment of the present invention.

FIG. 9 is a plan view showing a vicinity of first and second bonding portions in a fourth embodiment. FIG. 10 is a sectional view taken along a line II-II in FIG. 9 and showing the vicinity of the first and second bonding portions in the fourth embodiment.

As shown in FIG. 10, a vibration device of the present embodiment is different from that of the first embodiment in a mode of bonding a first elastic plate 32a and a second elastic plate 32b. Except for the above points, the vibration device of the present embodiment has the same configuration as that of the vibration device 1 of the first embodiment.

More specifically, a first bonding portion 33a and a second bonding portion 33b are rivets that penetrate a laminated portion 32a3 of the first elastic plate 32a, and reach inside the second elastic plate 32b. The first bonding portion 33a and the second bonding portion 33b have respective overhang portions 33a1 and 33b1 that protrude outward in plan view and are in contact with a second surface 32a8 of the first elastic plate 32a. Thus, the first elastic plate 32a and the second elastic plate 32b can be suitably bonded to each other and fixed. As shown in FIG. 9 and FIG. 10, the first bonding portion 33a and the second bonding portion 33b are not in contact with each other.

Each of the first bonding portion 33a and the second bonding portion 33b may have a protruding portion that protrudes outward in plan view, at a portion that penetrates the first elastic plate 32a, and a portion that reaches inside the second elastic plate 32b. Accordingly, bonding force between the first elastic plate 32a and the second elastic plate 32b can be suitably increased. Note that in this case, it is preferable that the second elastic plate 32b be made of resin. Thus, the first elastic plate 32a and the second elastic plate 32b can be suitably bonded to each other and fixed.

In the fourth embodiment, through-holes are provided in portions where the first bonding portion 33a and the second bonding portion 33b of the first elastic plate 32a are provided. Therefore, there is a possibility that cracking due to application of stress easily occurs in a portion of the first elastic plate 32a where the second bonding portion 33b is provided. Thus, as in the first embodiment, it is preferable that a plurality of the second bonding portions 33b be not in contact with each other, and it is more preferable that the plurality of second bonding portions 33b be provided at equal intervals. In plan view, it is preferable that a portion of the second bonding portion 33b closest to the first end portion be curved. It is also preferable that a portion of the through-hole of the first elastic plate 32a provided with the second bonding portion 33b, that is closest to the first end portion, be curved.

Further, in a portion where the first elastic plate 32a and the second elastic plate 32b are laminated, it is preferable that a thickness of the second elastic plate 32b be larger than a thickness of the first elastic plate 32a. In this case, since respective thicknesses of the first bonding portion 33a and the second bonding portion 33b can be increased, bonding force between the first elastic plate 32a and the second elastic plate 32b can be effectively increased. Note that the above respective thicknesses of the first bonding portion 33a and the second bonding portion 33b are thicknesses in a direction parallel to a thickness direction of the first and second elastic plates.

Figure 11:
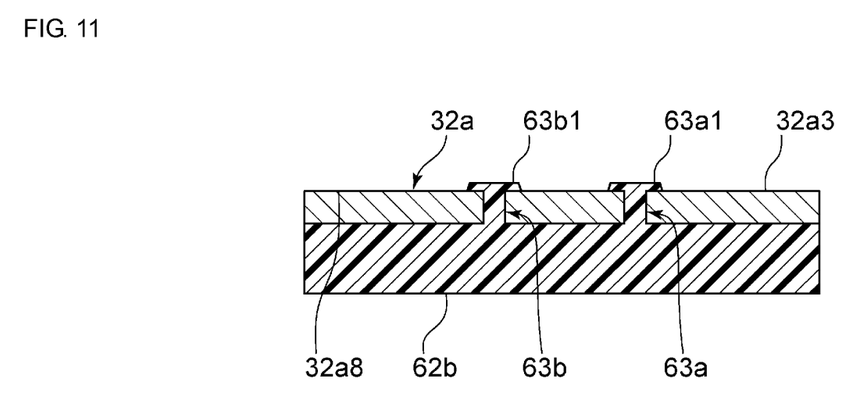
FIG. 11 is a sectional view corresponding to a portion taken along the line II-II in FIG. 9 and showing a vicinity of first and second bonding portions in a modification of the fourth embodiment of the present invention.

As in a modification of the fourth embodiment shown in FIG. 11, a first bonding portion 63a, a second bonding portion 63b, and a second elastic plate 62b may be made of resin. In the modification, the first bonding portion 63a, the second bonding portion 63b, and the second elastic plate 62b are integrated. As in the fourth embodiment, the first bonding portion 63a and the second bonding portion 63b penetrate the first elastic plate 32a, and have overhang portions 63a1 and 63b1, respectively.

It is preferable that the first bonding portion 63a, the second bonding portion 63b, and the second elastic plate 62b be made of the same resin. Thus, the first bonding portion 63a, the second bonding portion 63b, and the second elastic plate 62b can be suitably integrated. Therefore, the first elastic plate 32a and the second elastic plate 62b can be suitably bonded to each other.

In manufacturing a vibration device in which the first bonding portion 63a, the second bonding portion 63b, and the second elastic plate 62b are made of the same resin, for example, through-holes are provided in the laminated portion 32a3 of the first elastic plate 32a. Next, the second elastic plate 62b is heated to soften resin for the second elastic plate 62b. Next, in this state, the laminated portion 32a3 of the first elastic plate 32a is brought into contact with the above resin and pressed, so that the above resin is filled in the through-holes. At this time, the first elastic plate 32a is pressed until the above resin reaches the second surface 32a8 of the first elastic plate 32a. As a result, the first bonding portion 63a and the second bonding portion 63b can be formed.

REFERENCE SIGNS LIST

VIBRATION DEVICE
2a FIRST ELASTIC PLATE
2a1 PLANAR PORTION
2a2 CONNECTING PORTION

2a3 LAMINATED PORTION
2a5, 2a6 FIRST AND SECOND END PORTIONS
2a7, 2a8 FIRST AND SECOND SURFACES
2b SECOND ELASTIC PLATE
2b5, 2b6 THIRD AND FOURTH END PORTIONS
3a, 3b FIRST AND SECOND BONDING PORTIONS
4 PIEZOELECTRIC VIBRATION ELEMENT
5 MASS ADDING MEMBER
12a FIRST ELASTIC PLATE
13a, 13b FIRST AND SECOND BONDING PORTIONS
21 VIBRATION DEVICE
22a ELASTIC PLATE
22a5, 22a6 FIRST AND SECOND END PORTIONS
22b, 22c FIRST AND SECOND BASE MEMBERS
22b5, 22c5 FIRST SIDE SURFACES
22b6, 22c6 SECOND SIDE SURFACES
22b7, 22c7 FIRST MAIN SURFACES
22b8, 22c8 SECOND MAIN SURFACES
23c, 23d THIRD AND FOURTH BONDING PORTIONS
32a, 32b FIRST AND SECOND ELASTIC PLATES
32a3 LAMINATED PORTION
32a8 SECOND SURFACE
33a, 33b FIRST AND SECOND BONDING PORTIONS
33a1, 33b1 OVERHANG PORTIONS
42a, 42b FIRST AND SECOND ELASTIC PLATES
42b6 FOURTH END PORTION
51 VIBRATION DEVICE
52a ELASTIC PLATE
52a5, 52a6 FIRST AND SECOND END PORTIONS
62b SECOND ELASTIC PLATE
63a, 63b FIRST AND SECOND BONDING PORTIONS
63a1, 63b1 OVERHANG PORTIONS

The invention claimed is:

1. A vibration device, comprising:
a first elastic plate having first and second end portions, and first and second surfaces facing each other and connecting the first and second end portions;
a first base member laminated to the first surface of the first elastic plate at the second end portion thereof;
a piezoelectric vibration element on at least one of the first and second surfaces of the first elastic plate; and
first and second bonding portions, the first and second bonding portions being portions where the first elastic plate and the first base member are welded to each other, the second bonding portion located closer to the first end portion of the first elastic plate than the first bonding portion.

2. The vibration device according to claim 1, wherein
in a plan view of the vibration device, the first elastic plate has a length direction connecting the first end portion with the second end portion, and a width direction perpendicular to the length direction, and
the vibration device includes a plurality of first bonding portions along the width direction, and a plurality of second bonding portions along the width direction.

3. The vibration device according to claim 2, wherein the plurality of second bonding portions are not in contact with each other.

4. The vibration device according to claim 3, wherein the plurality of second bonding portions are provided at equal intervals.

5. The vibration device according to claim 1, wherein a thickness of the first base member is larger than a thickness of the first elastic plate at least in the portion where the first elastic plate and the first base member are laminated to each other.

6. The vibration device according to claim 1, wherein in a plan view of the vibration device, a portion of the second bonding portion closest to the first end portion is curved.

7. The vibration device according to claim 1, wherein the first and second bonding portions are made of a member separate from the first elastic plate, and the first and second bonding portions penetrate the first elastic plate and the first base member.

8. The vibration device according to claim 1, further comprising a mass adding member attached to the first end portion of the first elastic plate.

9. The vibration device according to claim 8, wherein the first base member is a second elastic plate.

10. The vibration device according to claim 9, wherein a surface of the mass adding member facing the second elastic plate has an inclined surface.

11. The vibration device according to claim 1, wherein
the first base member is a second elastic plate facing the first elastic plate,
the first elastic plate has a planar portion including the first end portion, a laminated portion that is laminated to the second elastic plate, and a connecting portion that connects the planar portion with the laminated portion, and
the laminated portion extends from the connecting portion in a direction opposite to the first end portion, and the first surface is parallel in the laminated portion and the planar portion.

12. The vibration device according to claim 1, wherein the first elastic plate and the first base member are made of metal.

13. A vibration device, comprising:
a first elastic plate having first and second end portions, and first and second surfaces facing each other and connecting the first and second end portions;
a first base member laminated to the first surface of the first elastic plate at the second end portion thereof;
a piezoelectric vibration element on at least one of the first and second surfaces of the first elastic plate; and
first and second bonding portions bonding the first elastic plate and the first base member to each other on a portion where the first elastic plate and the first base member are laminated to each other, the second bonding portion located closer to the first end portion of the first elastic plate than the first bonding portion,
wherein the first and second bonding portions are portions where the first elastic plate and the first base member are welded to each other, and
wherein in a plan view of the vibration device, the first bonding portion and the second bonding portion are in contact with each other.

14. The vibration device, comprising:
a first elastic plate having first and second end portions, and first and second surfaces facing each other and connecting the first and second end portions;
a first base member laminated to the first surface of the first elastic plate at the second end portion thereof;
a piezoelectric vibration element on at least one of the first and second surfaces of the first elastic plate;
first and second bonding portions bonding the first elastic plate and the first base member to each other on a portion where the first elastic plate and the first base member are laminated to each other, the second bonding portion located closer to the first end portion of the first elastic plate than the first bonding portion;
a second base member laminated to the first surface of the first elastic plate at the first end portion thereof; and third and fourth bonding portions bonding the first elastic plate and the second base member to each other on a portion where the first elastic plate and the second base member are laminated to each other, the fourth bonding portion located closer to the second end portion of the first elastic plate than the third bonding portion.

\* \* \* \* \*